(12) United States Patent
Moore et al.

(10) Patent No.: US 10,000,675 B2
(45) Date of Patent: Jun. 19, 2018

(54) TEMPORARY ADHESIVE WITH TUNABLE ADHESION FORCE SUFFICIENT FOR PROCESSING THIN SOLID MATERIALS

(71) Applicant: John Cleaon Moore, Camarillo, CA (US)

(72) Inventors: John Cleaon Moore, Camirillo, CA (US); Jared Pettit, Camarillo, CA (US); Alman Law, Camarilo, CA (US)

( * ) Notice: Subject to any disclaimer, the term of this patent is extended or adjusted under 35 U.S.C. 154(b) by 187 days.

(21) Appl. No.: 14/772,368

(22) PCT Filed: Feb. 28, 2014

(86) PCT No.: PCT/US2014/019376
§ 371 (c)(1),
(2) Date: Sep. 2, 2015

(87) PCT Pub. No.: WO2014/137801
PCT Pub. Date: Sep. 12, 2014

(65) Prior Publication Data
US 2016/0017196 A1    Jan. 21, 2016

Related U.S. Application Data

(60) Provisional application No. 61/771,925, filed on Mar. 3, 2013.

(51) Int. Cl.
*C09J 183/04* (2006.01)
*H01L 21/683* (2006.01)
(Continued)

(52) U.S. Cl.
CPC ............. *C09J 183/04* (2013.01); *C08K 3/013* (2018.01); *C09J 7/20* (2018.01); *C09J 133/00* (2013.01);
(Continued)

(58) Field of Classification Search
None
See application file for complete search history.

(56) References Cited

U.S. PATENT DOCUMENTS 4,657,959 A * 4/1987 Bryan ............... A61K 6/10
264/16
5,735,945 A * 4/1998 Chen ............... C09D 183/04
106/2
(Continued)

FOREIGN PATENT DOCUMENTS

WO    WO-2012162640 A2 * 11/2012    ......... C08G 18/0819
WO    WO 2013013986 A2 *  1/2013    ............... C09J 5/00

*Primary Examiner* — Robert S Loewe

(57) ABSTRACT

Compositions and methods are described for a temporary adhesive with adjustable adhesion force to affix a thin solid material onto a carrier whereby the force of adhesion is defined by choosing and adjusting the polymeric resin components to provide sufficient adhesion to support a manufacturing process, and upon completion, the thin solid material is removed by an external applied force of a given value that overcomes the adhesive force without harm to the thin solid material. The temporary adhesive provides a tunable adhesion force that is lower than the tensile strength of the thin solid material, preferably less than 50%, more preferably less than 25%, and most preferably less than 10% of the tensile strength of the thin solid material. The temporary adhesive may be applied and cured in a variety of ways that meet the needs of the form of the thin solid material and objectives of the manufacturing process. The invention provides benefits of flexibility and reduced cost when establishing practices to handle difficult thin solid materials in the manufacture of semiconductors and flat panel displays.

21 Claims, 1 Drawing Sheet

(51) Int. Cl.
*C09J 133/00* (2006.01)
*H01L 23/00* (2006.01)
*C09J 163/00* (2006.01)

(52) U.S. Cl.
CPC .......... *H01L 21/6835* (2013.01); *H01L 24/83* (2013.01); *H01L 24/98* (2013.01); *C09J 163/00* (2013.01); *C09J 2205/302* (2013.01); *H01L 2221/6834* (2013.01); *H01L 2221/68327* (2013.01); *H01L 2221/68381* (2013.01)

(56) References Cited

U.S. PATENT DOCUMENTS

| | | | | |
|---|---|---|---|---|
| 5,863,884 A * | 1/1999 | Lafreniere | C09D 9/04 | 510/412 |
| 6,325,885 B1 * | 12/2001 | Harrison | C09J 5/00 | 156/306.3 |
| 6,515,069 B1 * | 2/2003 | Gervasi | C08G 77/385 | 106/2 |
| 7,198,822 B2 * | 4/2007 | Steinwandt | E04B 1/6801 | 427/271 |
| 7,541,264 B2 * | 6/2009 | Gardner | C09J 5/06 | 257/E21.122 |
| 7,964,552 B2 * | 6/2011 | Herzog | C09D 7/06 | 252/8.62 |
| 8,092,736 B2 * | 1/2012 | Moffett | B29C 33/62 | 264/300 |
| 8,334,037 B2 * | 12/2012 | Sheridan | B32B 27/00 | 428/40.7 |
| 8,999,451 B2 * | 4/2015 | Tysak | C09D 171/02 | 252/8.57 |
| 2003/0113555 A1 * | 6/2003 | Pellerite | C08G 65/007 | 428/447 |
| 2005/0162493 A1 * | 7/2005 | Gross | B41J 2/3355 | 347/100 |
| 2005/0250668 A1 * | 11/2005 | Serobian | C09G 1/16 | 510/466 |
| 2006/0207967 A1 * | 9/2006 | Bocko | B32B 7/06 | 216/24 |
| 2006/0251906 A1 * | 11/2006 | Liao | B82Y 30/00 | 428/446 |
| 2007/0134444 A1 * | 6/2007 | Harding | C09K 19/2007 | 428/1.21 |
| 2007/0134459 A1 * | 6/2007 | Hubert | B32B 37/00 | 428/40.1 |
| 2008/0257217 A1 * | 10/2008 | Yamaguchi | C09D 7/001 | 106/311 |
| 2010/0092768 A1 * | 4/2010 | Neubert | B32B 7/06 | 428/337 |
| 2011/0069467 A1 * | 3/2011 | Flaim | H01L 21/6835 | 361/807 |
| 2011/0118428 A1 * | 5/2011 | Hierse | C07C 69/65 | 526/247 |
| 2011/0200765 A1 * | 8/2011 | Uyttendaele | B41M 5/267 | 428/29 |
| 2011/0253315 A1 * | 10/2011 | George | H01L 21/67092 | 156/718 |
| 2012/0111233 A1 * | 5/2012 | Hierse | B01F 17/0035 | 106/499 |
| 2012/0172479 A1 * | 7/2012 | Rhodes | C08K 5/04 | 522/75 |
| 2013/0084459 A1 * | 4/2013 | Larson | C09J 4/00 | 428/422 |
| 2013/0192754 A1 * | 8/2013 | Dukkipati | H01L 21/02 | 156/308.2 |
| 2013/0201635 A1 * | 8/2013 | Xu | B32B 7/12 | 361/748 |

* cited by examiner

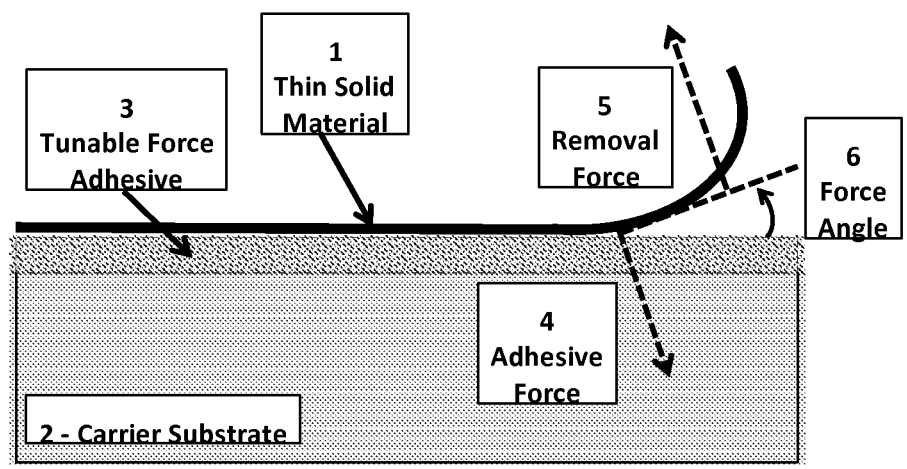

TEMPORARY ADHESIVE WITH TUNABLE ADHESION FORCE SUFFICIENT FOR PROCESSING THIN SOLID MATERIALS

FIELD OF THE INVENTION

The present invention relates generally to an adhesive that is applied to a hard and rigid carrier substrate upon which thin solid materials are bonded and sufficiently held in place to support several manufacturing steps whereby they are subsequently removed without observable harm to the integrity of the thin solid material. In particular, the adhesive force is adjustable by tuning the chemistry such that it holds the thin solid material in place to an extent that satisfies the physical, thermal, and chemical effects of a manufacturing process while also allowing it to be easily removed by applying that exceeds the adhesive force yet is less than the tensile force of the thin solid material in a specific configuration that removes it from the rigid carrier. The value and importance of a tunable adhesive is recognized in the manufacture of thin electronic devices such as flexible displays or semiconductors, where such thin solid materials vary widely in thickness, flexibility, brittleness, shape, and configuration, allowing the the user to vary adhesive force as needed to rapidly affix the thin solid materials to rigid tooling, satisfy their manufacturing demands, quickly and safely remove them, and to do this without significant burdens of time or cost.

BACKGROUND OF THE INVENTION

Electronic devices face continued pressure to design and produce their configurations in a further state of miniaturization, ergonomically pleasing shapes, and a reduced weight. To achieve these goals, many choices in materials of construction and shape must be exercised during upstream manufacturing. Whenever changes occur in the product, invariably there are also changes in tooling. Retooling a fabrication facility requires significant time and cost for requalification. For electronic manufacturing, the substrate must be held uniformly in place during several process steps, including lithography and deposition. Thin solid materials are typically held in place by affixing to a rigid carrier. Carrier substrates may be composed of sapphire, quartz, certain glasses, or silicon, exist in thicknesses from 0.5-1.5 mm (500-1,500 µm), and be of larger area than the thin solid material. Challenges exist in choosing a means of adhesion that offers sufficient adhesive force and quality to withstand the manufacturing process, while allowing the thin solid materials to be easily removed without damaging their integrity.

Several alternative thin solid materials are being considered for use in manufacturing. Conventional glass substrates used in the manufacture of displays are being reduced in thickness to 0.1 mm (100 µm) or less. In some cases, alternatives to glass are being considered, including non-glass inorganic and organic materials that exhibit intrinsic properties to support the application of layered metal and dielectric patterns onto its surface to a sufficient level necessary to produce an electronic device. In some cases, the thin solid material not only supports the laminated electronic layers but also offers sufficient tensile strength and ductility and/or elasticity to allow bending of the substrate in configurations necessary to classify it as a flexible display. These thin solid materials may vary in thickness to as high as 100 µm or to below 10 µm. Whether the material is glass or ceramic, metal, organic, or a composite, they require certain care in the handling, affixing, and removal from carrier substrates. It is well known that as material type, thickness, and shape varies, the method and means to handle such units will also vary. For example, the handling of a 12" diameter round piece of domestic type aluminum metal foil (e.g. thickness 2 mil, ~50 µm), although it will wrinkle, is easier to handle than the same size and thickness of silicon, which is prone to cracking and breaking and is unable to support its own weight. As the need for adjusting the tooling and support required to handle thin solid materials, so also exists the demand for adhesives that exhibit a range in adhesive force, or the ability to tune adhesion.

Common tape adhesives do not adequately support thin solid materials with the necessary rigidity and uniformity to meet electronic processing objectives. The tape adhesive is much too elastic for mechanical stability during certain manufacturing steps such as polishing or grinding. Additionally, the composition of many tapes are based upon acrylic or silicone chemistry and are observed to exhibit outgassing (weight loss) due to material degradation at elevated temperatures at or above 400° C. The characteristic of outgassing will cause gas bubbles in-between the carrier substrate and the thin solid material which deforms the surface of the thin material, and in severe instances, will perforate the surface to cause catastrophic damage to the sensitive circuitry deposited upon the surface. For both mechanical and thermal resistance, there is a need for a system that can be inserted between two hard substrates and achieve the necessary thermal and chemical resistance requirements of the customer process. In this case, a thermal resistance that reaches 400° C. or more is necessary. To this end, it is desired to have an adhesive which offers sufficient thermal and chemical resistance to support electronic manufacturing processes for display operations and is easy to remove by tensile pulling (peeling) from the substrate to reveal a film with a built electronic structure.

SUMMARY OF THE INVENTION

This invention describes a liquid chemical mixture that comprises a resin system, whereby it is applied in a manner such that it becomes inserted between a thin solid material and a rigid carrier substrate to act as a temporary adhesive by offering a tunable (adjustable) adhesive force sufficient to support a series of process steps in manufacturing and allows the removal of the thin solid material by the application of an external force in a specific orientation to lift-off or peel without harm to the thin solid material. The tunable adhesive force for affixing a specific thin solid material to a carrier and satisfactory meets the requirements of manufacturing shall be lower than the tensile strength of the thin solid material, preferably less than 50% of the thin solid material's tensile strength. More preferably, the tunable adhesive force sufficient for manufacturing shall be <25% of the tensile strength, and most preferably <10% of the respective tensile strength.

The chemistry of the temporary adhesive is comprised of resins from one or more polymer families, including but not limited to, epoxies, acrylates, silicones, urethanes, and rubbers, and engineering polymers. These resins may exist as thermoplastic or thermoset materials. Those who are familiar with the art recognize these materials exhibit different organic functionality and as such, are known to interact accordingly to the chemistry of certain substrates.

Although most, if not all, applications for coatings and interfacial bonding and affixing practices are designed for permanence, the objective of this invention is for temporary applications. Adhesion of thin solid materials to carrier substrates is known in many manufacturing practices. The removal aspect of these processes can pose serious challenges. In overcoming these barriers, existing practice involves the use of heat, simultaneous heat and shear stress, laser ablation of the interface to destroy bonding, or chemical diffusion to dissolve the adhesive. These and combinations of such practices prove a great hardship, complexity, and huge cost, for handling thin solid materials.

The use of a temporary adhesive with a tunable adhesive force may affix the thin solid material, satisfy the manufacturing demand subjected to it, and then enable removal by the application of an external force to overcome the adhesion without damage to the integrity of the thin solid material. This invention provides diversity in its form to apply to a wide range of substrates and manufacturing practices such that the temporary nature and benefit of its development can be customized for many objectives.

DESCRIPTION OF THE PREFERRED EMBODIMENTS

In the case of bonding a thin solid material to a hard carrier, an adhesive is applied between the surfaces with a tunable adhesive force. The force experienced between the thin solid material and carrier is defined by the adhesive chemistry. In FIG. 1, we define a tunable force adhesive (3) exhibiting an adhesive force (4) affixing the thin solid material (1) to the carrier (2) such that it may be removed with an applied external removal force (5) in a configuration and force angle (6)

A thin solid material is held onto a carrier with an adhesive whereby the force of adhesion is defined by adjusting its chemistry to provide sufficient adhesion to support a manufacturing process, and upon completion, the thin solid material may be removed by an external applied force of a given value that easily overcomes the adhesive force. An ideal adhesive force is lower than the tensile strength of the thin solid material, and preferred to be less than 50% of the tensile strength, and more preferred to be <25%, or even <10%, to ensure that no harm occurs to the thin solid material during the removal process.

This invention describes a liquid chemical mixture that comprises a reactive resin system, the application of which to solid substrates may be applied and cured in a variety of ways to produce a final condition whereby the chemistry is present as the interface between two given surfaces and acts as an adhesive to affix such surfaces. During the application and use of the chemistry, it is initiated, cured, or reacted to produce an adhesion force of a given measurable value using conventional peel testing practices. It is well known that the given measurable value will be dependent upon several factors, including the substrate composition, condition of the substrate surface, texture and/or porosity of the surface, and history of thermal exposure of the adhesive and/or the adhered substrates. Additionally, the measured value of adhesion by peel testing is also dependent upon the method of testing that includes the peel angle (i.e. 90 or 180 degrees), width of the peel area, and the speed of peeling the specimen. Given these variable conditions are well understood by those familiar with the art, they can been controlled and maintained uniform(ly) such that the adhesive force may be studied by adjusting the chemistry of the adhesive. In this case, it is observed that the measured adhesive force is dependent upon the corresponding changes in the chemistry of the adhesive. Using this understanding, there can be chemical adjustments made in a manner that will govern the measured adhesion force. In other words, through the selection and adjustment of chemistry, the adhesive force that affixes a thin solid material to a carrier substrate may be tuned to achieve a specific value sufficient to support a manufacturing process yet allow its rapid removal by an external applied force without harm or change to its form.

A variety of thin solid materials may be used with this invention to include inorganic and organic films. Inorganic thin solid materials include films and foils of metals and ceramics. Metal films and foils may be used to include copper (Cu), nickel (Ni), iron (Fe), cobalt (Co), titanium (Ti), tantalum (Ta), tungsten (W), molybdenum (Mo), chromium (Cr), aluminum (Al), gold (Au), silver (Ag), neodymium (Ne), palladium (Pd), platinum (Pt), osmium (Os), iridinium (Ir), rhodium (Rh), ruthenium (Ru), nitrides thereof, such as titanium nitride (TiN), and alloys thereof, such as nickel iron (NiFe). Thin solid metals may exist initially as foils or may be vacuum deposited onto a temporary adhesive such that a thin solid form of the metal is completed to a level that its integrity is of a minimum requirement sufficient to proceed with manufacturing and may be removed later by an external applied force. The minimum integrity of the thin solid metal material may be defined by several properties, to include a tensile strength that exceeds the adhesion force of the temporary adhesive.

Thin solid materials may exist in crystalline and amorphous forms to include silicon, gallium arsenide, quartz, glass, and alloying mixtures thereof. These ceramic and glass materials may exist initially as foils or films. Thin solid ceramic and glass materials may be produced by various deposition methods onto a temporary adhesive such that its integrity meets a minimum requirement sufficient to proceed with manufacturing and may be removed later by an external applied force. The minimum integrity of the thin solid material may be defined by several properties, to include a tensile strength.

Organic films which represent temporary adhered thin solid materials include polyimides such as Kapton® (registered trade mark of E.I. du Pont de Nemours and Company), polyarylether such as Arylite® (registered trade mark of Ferrania), polyesters such as Mylar® (registered trade mark of DuPont Teijin Films), polypropylene, polyethylene, polysulfone (polysulfone, polyethersulfone, polyphenylsulfone) such as Radel® (registered trade mark of Solvay Solexis), polybenzimidazole, polyphenylene sulfide such as Torelina® (registered trade mark of Toray Film Products, Co., Ltd.), polycarbonate, polystyrene, polyacrylic, fluoropolymers as fluoroethylene propylene (FEP), perfluoroalkoxy polymer (PFA), ethyltetrafluoroethylene (ETFE), and ethylene-chlorotrifluoroethylene (ECTE) such as Halar® (registered trade mark of Solvay Solexis), polyvinylidene fluoride (PVDF) such as Kynar® (registered trade mark of Solvay Solexis), polyether ether ketone (PEEK), polyether imide (PEI), polybutylene terephthalate (PBT), polyethylene naphthalate (PEN), and various polyamides classified as nylon. Thin solid organic polymers may exist initially as films, may be cast from liquid solutions, or may be vacuum deposited directly onto a temporary adhesive such that a thin solid form of the polymer is completed to a level such that its integrity reaches a minimum requirement sufficient to proceed with manufacturing and be removed later by an external applied force. The minimum integrity of the thin solid polymer material may be defined by several properties, to include a tensile strength that exceeds the adhesion force of the temporary adhesive.

The tunable adhesive chemistry comprises polymeric resins from at least one specific chemical family and may also be combined with other separate chemical families. The adhesion force is controlled by the content adjustment of mixing resins of different molecular weights or functionality within a chemical family or by mixing between different chemical families. For example, one temporary adhesive may comprise one or more resins from the family of epoxy resins (i.e. alkyl epoxy, novolac epoxy, etc.) whereas, another temporary adhesive may comprise one or more resins from different chemical families (i.e. epoxy and acrylic, etc.). The variation of these resin choices will produce a direct effect on the adhesive force of the system in affixing the thin solid material onto the carrier substrate. Those familiar with the art recognize that in order to effect the reaction of such chemistries, there must also include the necessary initiators. These initiators are considered as cross-linkers, activators, catalysts, or reactors, and represent a small portion of the overall composition. Therefore, it shall be understood that whenever mention is made about the use of a specific chemistry or resin, that chemistry must include the respective initiator, and the choice of the initiator may produce certain subtle differences, the primary emphasis is that an initiator that is matched with the chemistry of choice must be included in the system.

The temporary adhesive chemistry may comprise a variety of base resins. The reactive resins include, but are not limited to, those undergoing cross-linking polymerization mechanisms, including epoxies, acrylates and silicones. These systems undergo thermal, chemical, and photo-initiated polymerization by condensation and addition mechanisms as described in the literature as thermosets. Thermoset chemistries offer rigidity and resistance to the process conditions. Non cross-linking resins include those described as amorphous or thermoplastics. The thermoplastic resins may add strength and durability to the adhesive. Additional properties by amorphous polymers include barrier (gas non-diffusion), temperature resistance, transparency, detergency, and water solubility. The following passages offer more detail on the resins used in the adhesive chemistry. The production of a temporary adhesive for use in this invention is not limited to the resins identified here.

Epoxy resins used for this invention may comprise a single or multiple epoxide functional group, also called oxirane, or ethoxyline, normally identified as a three-membered oxide ring described by the following structures classified as (1) glycidyl ethers, (2) glycidyl esters, (3) gylcidyl amines, (4) linear aliphatics, and (5) cycloaliphatics:

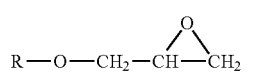

(1)

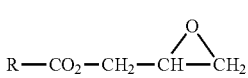

(2)

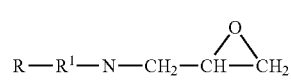

(3)

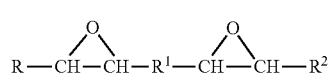

(4)

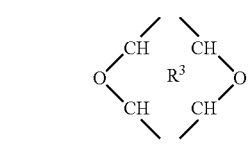

(5)

where both R, $R^1$, and $R^2$ may represent the following: hydrogen (—H), amide (—$NH_2$), methyl (—$CH_3$), hydroxyl (—OH), alcohol (—$CH_2OH$), or any one of the groups represented by the formula —$C_nH_{(2n)}$, —$C_nH_{(2n+1)}$, or —$C_nH_{(2n)}OH$ where n varies from 2-20; cyclic and aromatic hydrocarbon functional groups of the formula —$C_6X_5$, where X may be substituent groups such as hydrogen (—H), the halogens (—F, —Br, —Cl, —I), hydroxyl (—OH), and —COOH groups, $R^3$ represents a cyclic or aromatic structure of the formula —$C_6X_5$, where X may be substituent groups such as hydrogen (—H), the halogens (—F, —Br, —Cl, —I), hydroxyl (—OH), and —COOH groups, all of these variations may exist in multiple substituent formats, or monomers, as given in the example structure (6):

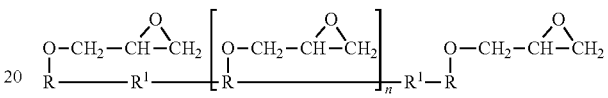

(6)

wherein structure (6) describes a polymer comprising monomers of glycidyl ether with substituent R and linked by $R^1$. Such resins may include: CARDOLITE 514 (difunctional glycidyl ether epoxy resin) produced by Cardolite Corporation, ADEKA EP 4088S (epoxy resin and urethane resin curing agent) produced by Adeka Corporation, EBECRYL3605 (partially acrylated bisphenol-A epoxy) produced by Cytec Industries, Inc.

In one embodiment, the epoxy resin includes that of structure (6), wherein the monomeric epoxide substituent is of the novolac variety, also referred to as epoxidized novolac resin, where R represents an aromatic ring of the form $C_6X_5$, where X may be substituent groups such as hydrogen (—H), the halogens (—F, —Br, —Cl, —I), hydroxyl (—OH), and —COOH groups, and the linkage $R^1$ is best represented by substituents of the formula —$C_nH_{(2n)}$. Such epoxy novolac resins include 3-6 epoxide groups per molecule (n=1.6) of the general formula exhibited by the structure (6). General commercialized products which meet this criteria include: DEN 431 and DEN 439 produced by The DOW Chemical Company; EPON 154, EPON 160 and EPON 161 produced by Resolution Performance Products (Hexion), REZICURE 3056 produced by SI Group.

Acrylic monomers and polymers used in this invention include acrylate esters by the general formula described in item (7), where both $R_1$ and $R_2$ may represent the following: hydrogen (—H), amide (—$NH_2$), methyl (—$CH_3$), hydroxyl (—OH), alcohol (—CH2OH), or any one of the groups represented by the formula —$C_nH_{(2n+1)}$ or —$C_nH_{(2n)}OH$ where n varies from 2-20; aromatic hydrocarbon functional groups of the formula —$C_6X_5$, where X may be substituent groups such as hydrogen (—H), the halogens (—F, —Br, —Cl, —I), hydroxyl (—OH), —COOH; and —$COOR_3$ groups, wherein $R_3$ represents the following: hydrogen (—H), amide (—$NH_2$), methyl (—$CH_3$), hydroxyl (—OH), alcohol (—CH2OH), or any one of the groups represented by the formula —$C_nH_{(2n+1)}$ or —$C_nH_{(2n)}OH$ where n varies from 2-20.

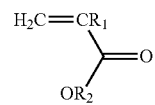

(7)

It is to be understood that where substituent groups are present, they should be present in a manner such that they do not unduly hinder or interfere with the thermal or photo initiated cure of the acrylic monomer. The preferred acrylic monomers are those represented by item (7), wherein $R_1$ is a hydrogen (—H), or methyl (—$CH_3$), defining the molecule as an acrylate or methacrylate, respectively, and $R_2$ to represent a substituent of the form or —$C_nH_{(2n)}OH$ where n varies from 2-20. Such preferred acrylics include hydroxyethyl acrylate (CAS #818-61-1), hydroxypropyl acrylate (CAS #25584-83-2), hydroxyethyl methacrylate (CAS #868-77-9), and hydroxy propyl methacrylate (CAS #27813-02-1). The more preferred acrylic monomers are those represented by item (7), wherein $R_1$ is a hydrogen (—H), or methyl (—$CH_3$), and $R_2$ to represent a substituent of the form amide (—$NH_2$), defining the molecule as an acrylamide. Such preferred acrylics include n,n-dimethylacrylamide (DMAA, CAS #2680-03-7). DMAA has been shown to exhibit high compatibility and solubility for other resins and a significantly faster curing time over the conventional acrylates or methacrylates.

Polysiloxane resins suitable for use herein exist in commerce by multiple suppliers, exhibiting broad classification differences in silicone subcategories, types, and polarities, and reacting through different mechanisms, including addition and condensation polymerization. The use of such materials in the preparation of the adhesive shall consider compatibility and reactivity between the polysiloxanes as a key factor in determining their final behavior. For example, species of similar polarity may be compatible yet be inconsistent in their preferred reaction mechanisms. These include organofunctional polysiloxanes and silicone resin intermediates, both are expected to undergo thermal initiated condensation reactions following hydrolysis. However, vinyl silicones (rubbers) are largely a phobic chemistry and undergo addition reactions with metal catalysts. Therefore, we will differentiate these chemistries accordingly, as their use in an adhesive is expected to follow the same considerations of compatibility and reactivity.

The preferred polysiloxanes include oxysilanes of the formulas represented as $(R_1)$—$[(R_2)(R_3)SiO]_n$—$R_4$ or $(R_5)$O—$[(R_3)_2SiO]_m$—$R_5$, where $R_1$, $R_2$, and $R_3$, may exist as a hydrogen or carbon containing functional group of the variety as alkyl, phenyl, cycloalkyl, alkoxy, hydroxyalkyl, alkoxyalkyl, and hydroxyalkyalkoxy, where these groups may contain up to 6 carbons, and $R_4$ comprises hydrogen, alkyl, or phenyl, where a minimum of 2 of the groups are oxy substituents used for polymerization, and $R_5$ is similar to $R_4$, however, there may exist up to 12 carbons, and n and m varies from 1-5 or to a sufficient number to reach a molecular weight of 500,000.

Siloxane resins suitable for use herein include a broad range of alkyl, aryl, oxygenated, and cyclic substitutions. In the case where thermal resistance is critical, the substitution will be methyl and phenyl. The moieties on the siloxane can also exhibit specific organic functional groups which are well known to interact with the chemistry of the substrate interface. For example, in the case of a mercaptan siloxane moiety, the sulfur group interacts with certain inorganic solid surfaces, such as metals, to increase the interfacial adhesion force. Most importantly, moieties which exhibit epoxy, acrylic, or amine character, are known to interact with a corresponding chemistry within an organic matrix and at the interface of polymeric solid surfaces, resulting in molecular entanglement and van der Waals interactions as hydrogen and covalent bonding, and ultimately, an increase of adhesion.

Silicone resins based on cyclic siloxane molecules are preferred. Useful cyclic silicones are hydroxy functional cyclic silicones classified as liquid resins, flake resins, and silicone intermediates as provided by suppliers Dow Corning (www.dowcorning.com) and Wacker Silicones (Wacker-Chemie GmbH) (www.wacker.com). Preferred cyclic siloxane choices for adhesive development, include those with high compatibility with other polymers, dissolution in a wide range of solvents, and those classified as silanols. These silanol compounds exhibit relatively high capacity for condensation reactivity and include those with two or more hydroxyl groups per cyclic silicone molecular unit and a phenyl/methyl ratio ranging from 50-120% and a molecular weight ranging from 4,000 to 300,000. In all cases, the relative content of silicon dioxide is high, usually greater than 50%.

The choice of initiator is dependent upon the polymer and the application. Epoxy based systems use organic amine and acid materials to open the oxirane ring and initiate cross-linking. These may be promoted by thermal or photo means. Free-radical initiators are used with acrylics, also promoted by applications that apply heat or ultraviolet exposure. Silicone vinyl compounds require metal catalysts to initiate free-radical generation. These classes of initiators and the required media to support polymerization and enable applications of the adhesive to facilitate fixation of the two surfaces. In one embodiment, an epoxy resin system is used with an initiator which is of the polyamine form and of higher molecular weight. Higher molecular weight amine chemistries will remain in the system for longer durations and provide an environment, which efficiently cross-links the epoxy resin. Amines may include triethylenetetramine (TETA), N-methylethanolamine (NMEA), and N-methyldiethanolamine (DMEA) produced by The DOW Chemical Company, and meta-xylenediamine (MXDA) as produced by Mitsubishi Chemical Company. Desirable amine amounts are typically present at levels from about 1% to about 5%, by weight as compared that of the epoxy. A similar approach for epoxies may also be used with acidic materials. The acids tend to have higher reaction rates with epoxies over that of amines. Preferred acids are various sulfonic acids such as toluene, dodecylbenzene, and methane sulfonic acids. The epoxy begins to react upon contact, so the means of mixing and application must be considered. Where acidic reactions are preferred for epoxies are in the case of photo acid generators (PAGs). These systems comprise sulfonium salts which release varying molecular weights of toluene sulfonic acid to cause immediate reaction. This rapid reaction is used in many photoresists. One common photoacid generator is triphenylsulfonium trifluoromethane sulfonate (TPST). Typical amounts of a PAG is in the range of <2% by weight of epoxy.

Initiators for acrylic monomers include thermal (thermal radical initiator, TRI) or photo activated free radical initiators. It is well known from the literature that these free-radical initiated systems will combine with the vinyl group of the acrylic, initiate a chain reaction, whereby the product acrylate free radical combines with other vinyl groups of adjacent acrylics and produce final crosslinked product. These TRI materials include inorganic persulfates such as ammonium persulfate (APS), potassium persulfate, and sodium persulfate, and organic persulfates such as quaternary ammonium persulfates (e.g. tridodecyl ammonium persulfate); peroxides include benzoyl peroxide (BPO), methyl ethyl ketone peroxide, dicumyl peroxide, and benzopinacole (BK), cumene dihydrogen peroxide, and those organic peroxides under the tradename Luperox™ (Arkema, Inc., www.arkema-inc.com), azo-compounds including 2,2'-azobisisobutyrnitrile (AIBN), 4,4-azobis(4-cyanovaleric acid), 1,1'-azobis(cyclohexanecarbonitrile), acetates as peracetic acid, and tert-butyl peracetate. Benzoin photoinitiators are common for use as initiators for acrylic chemistry. One type of benzoin photosensitizer is 2-phenylacetophenone, which undergoes photoscission to release radicals of benzoyl, and benzyl, which become the primary chain polymerization initiators in the curing process. Photochemically generated free radicals react directly with the double bond of the vinyl monomer as a chain-initiating step. The invention involves a cure process between a photoinitiator that is present in the liquid polymer system and actinic radiation from an ultraviolet emission source. Common photoinitiators include benzoin ethers, acetophenones, benzoyl oximes, and acylphosphines. These initiators may include phenylglyoxylate, benzyldimethylketal, $\alpha$aminoketone, $\alpha$hydroxyketone, monoacyl phosphine (MAPO), bisacylphosphine (BAPO), metallocene, and iodonium salt. Preferred initiators include 2-hydroxy-2-methyl-1-phenyl-1-propanone (CAS #7473-98-5) and phosphine oxide phenylbis(2,4,6-trimethylbenzoyl)—(CAS #162881-26-7). A trade name product, which represents these materials, includes Irgacure 2022, as manufactured by CIBA Specialty Chemicals, Basel, Switzerland. The product exhibits absorption maxima at 365 nm, 285 nm, and 240 nm. Concentrations are used anywhere at <5% by weight.

Adhesive mixtures which are chosen to use silicone resins may contain anywhere from 20-100% solids of silicone polymers having polysiloxane-vinyl and silyl-hydride character. In the presence of a metal catalyst, the vinyl compounds initiate free radicals which undergo addition polymerization with the silyl-hydride to produce a polymerized final product. To control the reaction rate for application and bonding, there are chelates binding the platinum. During heat exposure, the chelate degrades to release platinum and then triggers polymerization. In the case of silanol polysiloxanes, these monomers will crosslink upon heat exposure, usually in the range 200-250° C.

Additives may also be present to facilitate adjusted adhesion. For example, the use of fluoropolymers are known for surface sensitive activity. The addition of fluoropolymer surfactants meet this objective. Other common surfactants as nonionics or charged species as cationic or anionic may provide surface sensitive adjustments in adhesion and also allowing fluctuations in melt point to give an amorphous character to improve adhesion.

In addition to the resins, initiators, and additives, the chemistry of the temporary adhesive may also contain fillers. These are specifically exemplified by fibrous fillers such as glass fiber, asbestos, alumina fiber, ceramic fiber composed of both alumina and silica, boron fiber, zirconia fiber, silicon carbide fiber, metal fibers, polyester fibers, aramid fiber, nylon fibers, phenolic fibers, natural plant and animal fibers; granular or particulate fillers such as fused silica, precipitated silica, fumed silica, calcined silica, zinc oxide, calcined clay, carbon black, glass beads, alumina, talc, calcium carbonate, clay, aluminum hydroxide, barium sulfate, titanium dioxide, aluminum nitride, silicon carbide, magnesium oxide, beryllium oxide, kaolin, mica, zirconia, and so forth; and mixtures of two or more of the preceding.

There exist several mechanisms for curing, B-staging, reacting, and alike for inserting and affixing the adhesive between a thin solid material and the carrier substrate. As a fundamental characteristic of any adhesive, there must be sufficient wetting between both surfaces. Wetting is defined as the interaction of a lower contact angle (low energy) liquid or semi-solid onto a higher contact angle (higher energy) substrate. In many cases, the difference in surface energy between the adhesive and surface can be as low as 10 dynes/cm, however, the difference is preferably much larger. In optimum conditions, a lower energy adhesive will wet and spread over the higher energy surface of the substrate and achieve good wetting.

Although wetting is fundamental to the adhesion process, the resulting adhesive force is dependent upon the chemistry of the adhesive and the interaction of its chemical functionality with the substrate. This interaction is dependent upon the application, cure, and affixing steps. The adhesive chemistry may comprise organic resins in pure form (i.e. 100% solids) or dissolved into carrier solvents. Cure programs may involve a soft bake step to affix the material to the carrier substrate, followed by a hard bake whereby the thin solid substrate is held in direct contact with the B-stage adhesive affixed to the carrier substrate. The mechanism by which the adhesive is applied, cured, and the thin substrate is brought into contact with the adhesive includes a plurality of approaches which this invention is not limited. Choices on these approaches are based upon many considerations, including the handling of the thin solid material, cure mechanism, and that method which minimizes the existence of trapped air and completely fills any voids. Regardless of the approach, the final objective is to achieve a bonded form where the thin solid material is affixed to the carrier substrate, sufficient to allow the manufacturing process to proceed.

Once the manufacturing process is complete, removal of the thin solid substrate is performed. The exact mechanism may vary between conventional methods of tape peeling to a lift-off approach. Where necessary, the removal proceeds by applying an external removal force in a specific direction normal or defined by some angle referenced to the direction of the thin solid material. The amount of the applied external removal force is dependent upon the adhesion force applied in the affixing process. Typically, this force will be applied to a level that exceeds the adhesion force such that the thin solid material begins to lift-off from the carrier substrate. To reduce harm to the integrity of the thin solid material, the external force must not exceed the tensile strength of the thin solid material. Since the necessary external force to achieve removal is defined by the adhesion force, the adhesion force must be lower than the tensile strength of the thin solid material. It is preferable for the temporary adhesive to exhibit an adhesion force sufficient to support manufacturing that is less than 50% of the tensile strength of the thin solid material. More preferably, the adhesion force of the temporary adhesive should be less than 25% of the tensile strength of the thin solid material. Most preferably, the adhesion force of the temporary adhesive should be less than 10% of the tensile strength of the thin solid material.

Applications of handling and supporting thin solid materials are becoming a common challenge in the manufacturing of electronic devices. Due to the reduced cost structures continually promoted such models of cost reduction are best conducted in Asian countries where typical labor costs are low. To best meet these cost pressures, simple designs with many options offer the most flexibility in manufacturing. For example, semiconductor wafer substrates at the time of this publication are round with diameters up to 12", and use robot(s) to transfer from tool to cassette. Conversely, display panels are square or rectangular, can extend to more than 60" on a side, and are conveyorized. In consideration of thin solid materials for each market, substrate thickness may vary from as low as 10-100 μm (microns). By offering the flexibility to tune or adjust the adhesion force of the temporary adhesive in affixing thin solid materials to carriers for handling, there is given a broad range of options in manufacturing. These options reduce the need of new tooling and additional manufacturing steps. Through these practices and others not mentioned here, the invention's novelty and uniqueness is realized.

Prior art for affixing thin solid materials, such as silicon wafers, are described in U.S. Pat. No. 7,098,152 (2006) and U.S. Pat. No. 6,869,894 (2005), Moore, describe a rosin-urethane adhesive, whereby the wafer is removed by either chemical penetration through perforated carriers or by thermal slide by applying heat to above the melt point of the adhesive and using shear force onto the thin wafer. U.S. Pat. No. 7,232,770 (2007), Moore et al., describes a cross-linked silicone adhesive that is removed by the method of chemical penetration with a perforated carrier. Both chemical penetration and thermal slide techniques require delicate handling of thin solid materials during the removal process, and the use of large-scale volumes of cleaning chemistry, primarily organic solvents. The use of chemicals, such as organic solvents, in microelectronic manufacturing adds costs, human exposure to toxic substances, and environmental impact by the generation of hazardous waste. It is therefore desired for an adhesive system which does not require extensive handling of thin solid materials during removal and that does not mandate the use of additional chemistries during manufacturing.

Other applications which describe the adhesive support of thin solid materials are described in U.S. Patent Applications 2009/0017248 A1 (2009), Larson et al., 2009/0017323 A1 (2009), Webb et al., and in the International Application WO 2008/008931 A1 (2008), Webb et al. These applications describe the use of a curable acrylate and a photothermal conversion layer that is degraded during removal by a laser irradiation device. Such a device interacts with the substrate by burning or destroying the adhesion interface between the work unit and carrier substrate. Such an interaction can produce by products and residue which are not removable (cleaned), especially when the laser system and adhered surfaces are dynamically changing. Although the use of a laser has been demonstrated as a means of removing a thin solid material, it is generally believed this option will not meet the objectives of high-volume manufacturing of large panels and be made available at a cost that the industry can bear. For these reasons and others which are known by those familiar with the art, removal options which offer simplicity, high volume manufacturing, and low cost, are needed for thin solid materials affixed to carrier substrates.

While there is a desire to identify adhesive materials to support thin solid materials of various compositions, thicknesses, shapes, and sizes, there also, is a challenge to design a process that affixes the material work unit by a tool, and when finished with the process, will remove the item without deleterious effects to the substrate. The need for flexibility in the adhesive chemistry is great, whereby once the concept to affix and remove the work unit is identified, the need exists to tune the adhesive force such that it fits the interdependence between the properties of the thin solid material and the tooling in the manufacturing line. Since a continuing emphasis exists for the microelectronics industry to be green and improve safety, a desire exists for an adhesive to perform without subsequent surface cleaning of the removed thin solid material. Taking these challenges together, there is a pressing need to provide adhesives that offer tunable adhesion force for a broad range of manufacturing by affixing and removing a thin solid material onto a rigid carrier, meeting high throughput, is a green process, and is available at a reduced cost of ownership.

EXAMPLES

The compositions of the invention and the method of making of the examples are described. It is understood, however, that the invention is not meant to be limited to the details described therein. In the examples, the percentages provided are percent (%) by weight unless otherwise stated. The invention is further illustrated, without limitation, by the following examples. The measurement of performance and selectivity of the invention is conducted using practices readily accepted by the industry.

Coatings are produced on a Brewer Science, Inc. CB-100 spin-coater, while spray and encapsulation uses custom tooling designed at Daetec. Metrology data is generated by a XP-1 stylus profiler, AFP-200 atomic force profiler, and a Xi-100 optical profiler (www.kla-tencor.com), using equipment settings 5 mg stylus load, minimum 4 mm distance, and a speed of 0.5 mm/sec. Modified thermogravimetric test methodology for outgas is conducted by typical laboratory scales (+/−0.1 mg). UV cure equipment includes the Intelli-Ray 400 microprocessor controlled light curing system (www.uvitron.com). Furnace support uses box type #ST-1200C-121216 with microprocessor programming, nitrogen purge, and dispersion fan for chamber uniformity (www.sentrotech.com). Force gage M5-series with 90 degree sled and stand ESM301, fixtures, and software (www.mark-10.com).

Silicon wafers and glass plates (~0.5 mm thick) are used as the inorganic substrate (carrier substrate) upon which the adhesive is applied, cured, and subsequent affixing of a thin solid material is tested. This material forms the basis for the survey, which the invention is demonstrated. Multiple polymers are tested and described for each example.

Example #1

These experiments demonstrate the use of fluoropolymer additives to adjust adhesion of a specific adhesive. The fluoropolymer is added directly to the respective adhesive chemistry, mixed, applied to the substrate, cured, and the thin solid material is applied. In this case, the thin material is polyester with a tensile literature value of 29,000 psi (ASTM D2370), or ~2,600 g/cm for a ~10 μm thick film @1 cm width. Each of the polymer systems have 0.5% fluoropolymer addition as Chemguard S554-100 (www.chemguard.com). Results for manual peeling are listed in Table 1.

TABLE 1

Peel test as 90 degree manual pull, results as pass/fail.

| # | Adhesive | Adhesive Type | Debond original (no additive) | Debond (with additive) |
|---|----------|---------------|-------------------------------|------------------------|
| 1 | Silicone Rubber | Wet Bond | Fail | Pass |
| 2 | Silicone Rubber | Tape Type | Fail | Pass |
| 3 | Acrylic | Wet Bond, UV | Fail | Pass |
| 4 | Acrylic | Wet Bond, Thermal | Fail | Pass |

Example #2

Silicone vinyl rubber and cross linker are mixed with platinum catalyst and applied to a series glass substrates, cured, and PET films similar to Example #1 are affixed to the surface. Silicone chemistries available from Anderson & Associates (www.andisil.com). The adhesion force is measured using a modified peel test method ASTM D3330. The results for debond are listed in Table 2.

TABLE 2

Peel force as measured by weight designation for film removal.
Silicone vinyl rubber and cross linker are represented as % vinyl rubber.

| # | Silicone vinyl to cross linker ratio (%) | Peel Force (g/cm) |
|---|---|---|
| 1 | 60 | 28.7 |
| 2 | 61.5 | 13.7 |
| 3 | 63 | 12.5 |
| 4 | 64 | 12.5 |
| 5 | 65.5 | 7.5 |
| 6 | 66.7 | 7.5 |

Example #3

Liquid polyamideimide (PAI) as available from Solvay (Torlon TLV 4000) is prepared in a solvent solution of n,n-dimethylacetamide (DMAC). Glass plates are acquired and a mixture of adhesive comprising silanol flake resin (www.dowcorning.com) and polysiloxane (www.evonik) is prepared as 10% in propyleneglycol monomethylether (PM solvent). The adhesive coating is applied and cured sufficient to acquire a coating thickness of <0.5 um. The PAI solution is then coated onto the adhesive and cured sufficient to acquire a coating thickness of ~10 um. A peel test is then performed on the coating as compared to glass plates without the adhesive coating. Results are reported in Table 3.

TABLE 3

Peel force as measured by meter using method ASTM D3330.

| # | Condition of glass plate with PAI | Thickness PAI (um) | Tensile Strength (g/cm) | Peel Force (g/cm) |
|---|---|---|---|---|
| 1 | No adhesive (baseline) | ~10 um | 2400 | No peeling, tearing of film coating |
| 2 | No adhesive (baseline) | ~25 um | 3200 | No peeling, tearing of film coating |
| 2 | Adhesive present | ~10 um | 2400 | 25 |
| 3 | Adhesive present | ~25 um | 3200 | 40 |

BRIEF DESCRIPTION OF THE DRAWING

FIG. 1. Description of tunable force adhesive model, where thin solid material (1) is affixed to a carrier substrate (2) using tunable force adhesive (3) exhibiting adhesive force (4), where removal of the thin solid material is accomplished with an external removal force (5) applied at an angle (6)

What is claimed is:

1. A temporary adhesive, comprising a reactive silicone and further comprising a fluorosurfactant, that offers a tunable force of adhesion sufficient to affix a thin solid material onto a carrier substrate, and subsequently, with the aid of an external force, a thin solid material is removed without harm and without the need for a subsequent cleaning wherein a tunable force is modified through the addition of varying levels of fluorosurfactant to reduce interfacial force.

2. The temporary adhesive of claim 1 wherein the thin solid material comprises an organic resin from the group engineering polymer.

3. The organic resin of the thin solid material of claim 2 comprising an engineering polymer selected from the group consisting of polyimide, polyamide, polyamideimide, polybenzimidazole, polybenzoxazole, polysulfone, polyethersulfone, polyphenylsulfone, polyarylether, polyetheretherketone, polyvinyidenedifluoride, cyclic olefin copolymer, polyethylene terphthalate, polybutylene terephthalate, polyacrylonitrile, polyaryletherketone, polyketoneketone, styrene-acrylonitrile, polycarbonate, polystyrene, polyvinylchloride, polyphenylene sulfide, polytrimethylene terephthalate, polyvinylidene chloride, acrylonitrile butadiene styrene, and liquid crystal polymer.

4. The organic resin of the thin solid material of claim 3 further comprising one or more polymer reaction initiators.

5. The organic resin of the thin solid material of claim 4 wherein the initiators comprise one or more from the group organic acid, photoacid generator, photobase generator, organic amine, thermal free radical, and photoactive free radical producing.

6. The organic resin of the thin solid material of claim 2 wherein the resin contains a filler.

7. The organic resin of the thin solid material of claim 6 wherein the filler comprises one or more of the from the group nanoparticle, nanofiber, nanometal, fiber, glass bead, glass sphere, ceramic, and cellulose.

8. The temporary adhesive of claim 1 wherein the thin solid material is a solid comprising a film or foil.

9. The thin solid material of claim 8 wherein the film or foil is produced from chemical vapor deposition (CVD).

10. The thin solid material of claim 8 wherein the film or foil is produced from plasma deposition.

11. The thin solid material of claim 8 wherein the film or foil is produced from electrolytic deposition.

12. A temporary adhesive of claim 1 that offers a tunable force of adhesion sufficient to affix a thin solid material onto a carrier substrate, and subsequently, with the aid of an external force, the material is removed without harm and without the need for a subsequent cleaning process where the adhesion force is tuned to a value that is lower than the tensile strength of the thin solid material.

13. The temporary adhesive of claim 12 wherein the adhesion force is preferably tuned to <50% of the tensile strength of the thin solid material.

14. The temporary adhesive of claim 13 wherein the adhesion force is more preferably tuned to <25% of the tensile strength of the thin solid material.

15. The temporary adhesive of claim 14 wherein the adhesion force is most preferably tuned to <10% of the tensile strength of the thin solid material.

16. A manufacturing process using the temporary adhesive of claim 1 in which a thin solid material is affixed onto a carrier substrate, and subsequently, with the aid of an external force, the material is removed without harm and without the need for a subsequent cleaning process, where the process is electronics.

17. The manufacturing process of claim 16 where the process is semiconductor.

18. The manufacturing process of claim 17 where the process is display.

19. The temporary adhesive in claim 1 wherein the fluorosurfactant is selected from the group nonionic, cationic, and anionic.

20. The temporary adhesive in claim 19 wherein the fluorosurfactant is nonionic.

21. The temporary adhesive in claim 1 wherein the fluorosurfactant is at a level of 0.5% by weight.

* * * * *